United States Patent
Nitz

(10) Patent No.: US 8,386,214 B2
(45) Date of Patent: Feb. 26, 2013

(54) METHOD AND SYSTEM FOR SIMULATION OF AN MR IMAGE

(75) Inventor: Wolfgang Nitz, Buch (DE)

(73) Assignee: Siemens Aktiengesellschaft, Munich (DE)

( * ) Notice: Subject to any disclaimer, the term of this patent is extended or adjusted under 35 U.S.C. 154(b) by 894 days.

(21) Appl. No.: 12/498,517

(22) Filed: Jul. 7, 2009

(65) Prior Publication Data

US 2010/0004909 A1    Jan. 7, 2010

(30) Foreign Application Priority Data

Jul. 7, 2008   (DE) .......................... 10 2008 032 007

(51) Int. Cl.
G06F 7/60 (2006.01)
G06F 17/10 (2006.01)
(52) U.S. Cl. ........................................................ 703/2
(58) Field of Classification Search ................... 703/2
See application file for complete search history.

(56) References Cited

U.S. PATENT DOCUMENTS

| | | | |
|---|---|---|---|
| 5,519,320 A | 5/1996 | Kanayama et al. | |
| 6,466,813 B1 * | 10/2002 | Shukla et al. | 600/411 |
| 6,549,009 B1 * | 4/2003 | Hertz et al. | 324/309 |
| 6,801,800 B2 * | 10/2004 | Miyazaki et al. | 600/410 |
| 6,833,702 B1 * | 12/2004 | Linardos et al. | 324/309 |

OTHER PUBLICATIONS

"Simulation Procedure to Determine Nuclear Magnetic Resonance Imaging Pulse Sequence Parameters for Optimal Tissue Contrast," De Graff et al., J. Nucl. Med., vol. 27 (1986) pp. 281-286.
"MRI Simulation-Based Evaluation of Image-Processing and Classification Methods," Kwan et al., IEEE Trans. on Medical Imaging, vol. 18, No. 11 (1999), pp. 1085-1097.
"Virtual MRI: A PC-Based Simulation of a Clinical MR Scanner," Hackländer et al., Acad. Radiol., vol. 12 (2005) pp. 85-96.

* cited by examiner

*Primary Examiner* — Dwin M Craig
(74) *Attorney, Agent, or Firm* — Schiff Hardin LLP

(57) ABSTRACT

In a method and system for simulating a magnetic resonance image of an examination subject, imaging parameters are determined that correspond to an imaging sequence that will be used to generate a magnetic resonance image of an examination subject, this being the magnetic resonance image that is to be simulated. At least one item of anatomical information of the subject is determined, and signal-to-noise information of the MR system, with which the magnetic resonance image of the subject will be generated, also is determined. The magnetic resonance image is simulated in a processor in real time dependent on the determined imaging parameters, the determined anatomical information, and the determined signal-to-noise information. The simulated magnetic resonance image is then visually displayed.

11 Claims, 2 Drawing Sheets

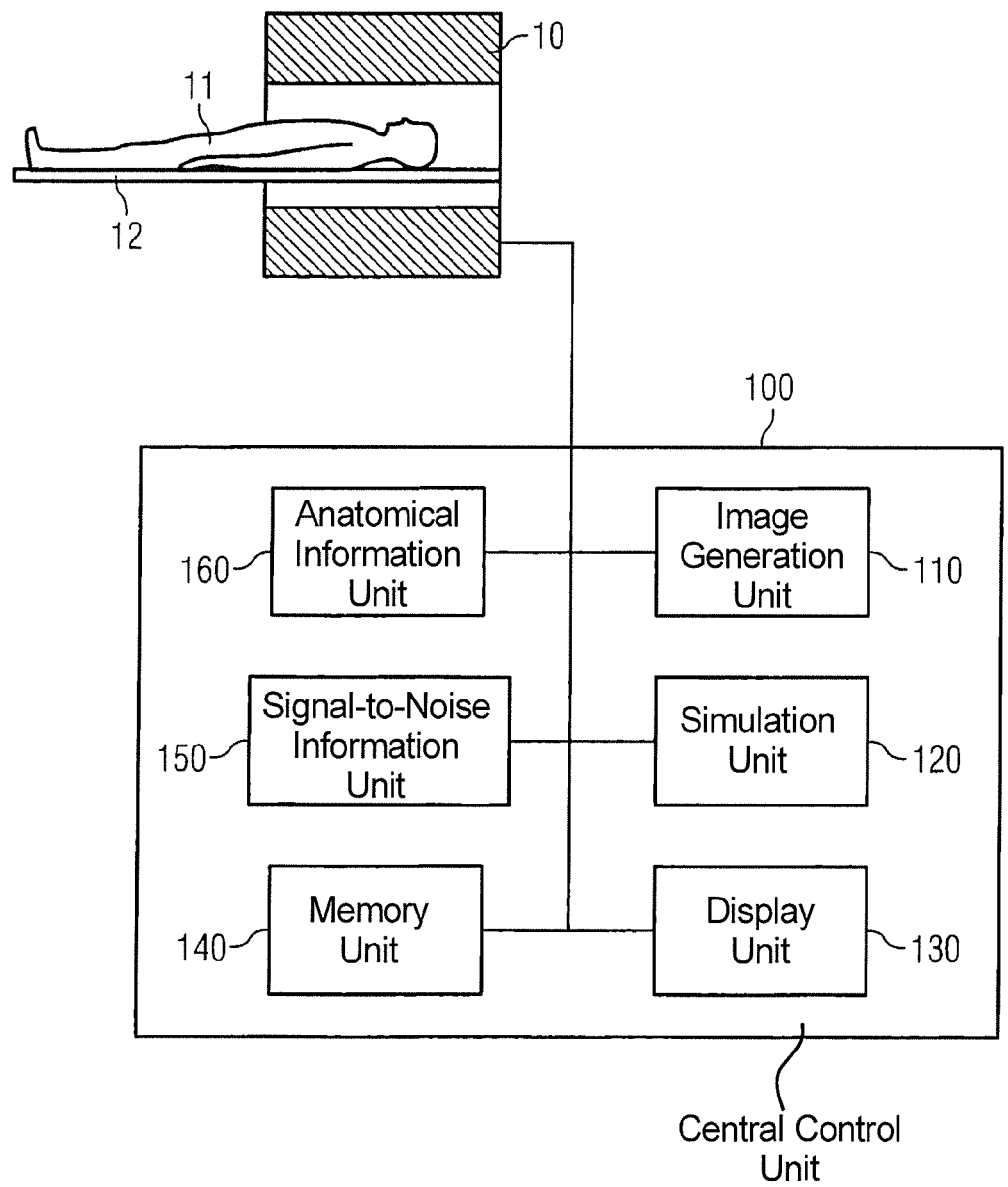

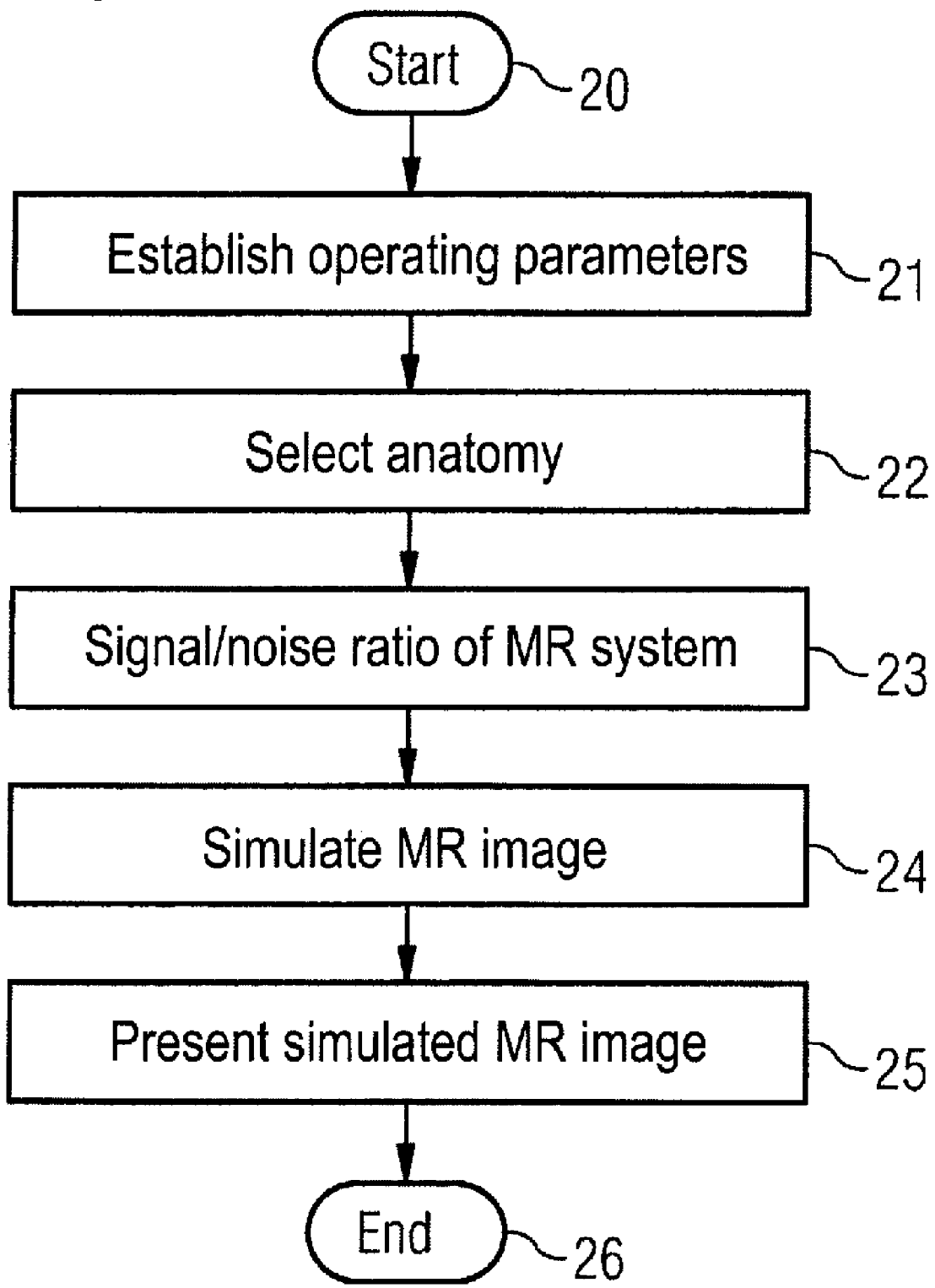

METHOD AND SYSTEM FOR SIMULATION OF AN MR IMAGE

BACKGROUND OF THE INVENTION

1. Field of the Invention

The present invention concerns a method for simulation of an MR image of an examination subject, and a system for implementing such a method.

2. Description of the Prior Art

Multiple tissue properties that have an influence on the image contrast and the image quality come into effect in magnetic resonance tomography (MR tomography). The image appearance is pathology-specific, and normally multiple images are generated at different contrasts in order to be able to make a differential diagnosis.

Furthermore, for specific questions it is known to propose protocol workflows that contain imaging sequences with suggested imaging parameters that can be used for specific questions. It is left to the user of the MR system to select from among the number of proposed imaging sequences and to modify the imaging parameters. Each parameter variation requires a measurement for verification, and this process is not always productive since the histories determining the result are often physically very complex, and the results of the optimization attempt often do not correspond to expectations.

SUMMARY OF THE INVENTION

An object of the present invention is to provide a procedure and system with which parameter variations can be checked quickly and simply.

According to a first aspect of the invention, in a method for simulation of an MR image of an examination subject, a measurement protocol is established that designated the coils that are used, the imaging sequence and the relevant imaging parameters associated with these that are used to generate the MR image that should be simulated. Furthermore, anatomical information of the examination subject is determined, meaning that the anatomical region to be examined is established. Signal-to-noise information of the MR system with which the MR image that is simulated should be generated is likewise determined. With the determined information (i.e. with the imaging parameters, the specific anatomical information and the signal-to-noise information of the MR system), the MR image is essentially simulated in real time and the simulated image is subsequently presented. Simulation in real time means that the simulated MR image is provided for the operator to view after determination of the individual factors. This time span should be less than 5 seconds, advantageously less than 3 seconds, more advantageously less than 1 second. Given changes of protocol parameters, an MR image that is displayed to the operator can be calculated depending on a sequence-specific, anatomy-specific and system-specific simulation calculation with the system-dependent signal-to-noise ratios. With the simulated MR image, the operator can decide before the actual measurement whether the time cost for the measurement is justified or not, or whether the measurement will probably not contain the information that is desired by the operator. Only if the simulated image exhibits a promising contrast can the operator actually conduct the measurement on the examination subject. Unnecessarily long measurements for testing purposes thus can be avoided.

The simulated MR image can then be presented in an image simulation on a user interface of the MR system, with the sequence type of the imaging sequence being taken into account in the simulation of the MR image, for example. The imaging parameters to be taken into account in the simulation are, among other things, repetition time $T_R$, echo time $T_E$, excitation angle, refocusing angle, existence of magnetization transfer pulses, existence of fat saturation pulses, inversion times, use of contrast agent, slice thickness, slice interval, echo train length or the variation of the refocusing angle. For example, the echo train length indicates how many echoes are read out as a signal per excitation.

One important factor that is taken into account in the MR simulation calculation is the sequence type, i.e. whether it is a spin echo sequence or fast spin echo sequence, a gradient echo sequence or the different known sub-forms, or modifications. Furthermore, sequence-specific parameters such as repetition time $T_R$, echo time $T_E$, excitation and refocusing angles etc. are taken into account Furthermore, parameters such as the spatial resolution and size as well as, for example, the measurement field size (field of view), the matrix size or the fact of the use of special acquisition techniques (for example the use of partial Fourier spaces, the averaging of multiple measurements, a supersampling to avoid aliasing of tissues lying outside of the field of view, the use of asymmetrical matrices or measurement fields, the bandwidth or band filters that are used) can furthermore be considered. An additional factor that can be considered in the simulation is whether alternative k-space trajectories (for example a radially symmetrical k-space readout) should be used in the signal acquisition. The PAT (Parallel Acquisition Technique) factor can likewise be established, which specifies to what extent information about the spatial positions of the nuclear spin signals inside the examined region should be taken into account with detection of the spatial distribution of the surface coils that are used for signal detection. Measurement time is thereby saved because the spatial information would otherwise have to be determined with additional phase codings. A reduction of measurement time given identical spatial resolution is always associated with an SNR loss, and the fast simulation should provide information to the user as to whether the real measurement will lead to images that satisfy the criteria of diagnostic capability.

The anatomical information that is necessary to simulate the MR image can be determined in various ways. First, a manual selection by the user is possible by, for example, the user establishing the position of an MR image to be acquired, on by the use of overview images generated from the examination subject, from which position an MR image should be simulated before a measurement is conducted. Furthermore, the position can be automatically concluded solely from the names of the measurement program since predetermined measurement positions (for example in various anatomical regions) are stipulated or are used particularly frequently, for example. This means that, given knowledge of the selected anatomy, the most probable position of the image plane that is typically used given the selected geometry is automatically selected. A data set that, standardized depending on the anatomical information, establishes or defines the signal portions that have a portion of the complete signal can form the basis for the creation of the simulated MR image, wherein the complete signal is the simulated MR image. For example, the signal portions can be the proton density, T1 time, T2 time, diffusion, perfusion, flux, magnetization transfer or susceptibility. These various signal portions exist for the typical anatomical structures such as head, neck, heart, liver, kidneys, pancreas, uterus, prostate and the skeletal musculature such as shoulder, elbow, wrist, hip, knee, ankle. One or more of the MR images of the examination subject that were previously acquired can likewise be used. These acquired MR images can be compared with the data set, wherein an image plane for the position of the MR image to be simulated is selected using the comparison. These previously acquired MR images can be overview exposures or special measurements tailored to this question. Furthermore, the measurement can also be used in order to obtain information about the signal-to-noise ratio which is used to simulate the MR image. This signal-to-noise ratio can also vary locally in the image. By examining previously acquired MR images of the examination subject, these local variations can now be taken into account in a simulation of the MR image given the use of the signal-to-noise information.

For better correlation of the automatically suggested simulated image plane and the image plane selected by the examination person, the previously used MR exposures (for example overview exposures) could be used, wherein these are compared with the predetermined data set in order to select the image plane for the position of the MR image to be simulated using the comparison.

The invention furthermore concerns a system for simulation of an MR image with a selection unit to determine the imaging parameters, a unit to determine the anatomical information and a unit to determine signal-to-noise information of the MR system. A simulation unit simulates the MR image under consideration of the imaging sequence and the imaging parameters connected with this, the specific anatomical information and the determined signal-to-noise information, wherein a display shows the simulated MR image.

BRIEF DESCRIPTION OF THE DRAWINGS

FIG. 1 schematically illustrates an MR system with a system for image simulation in accordance with the invention.

FIG. 2 is a flowchart for simulation of an MR image according to the invention.

DESCRIPTION OF THE PREFERRED EMBODIMENTS

Schematically shown in FIG. 1 is an MR system with which an MR image can be calculated in real time under consideration of sequence-specific, anatomy-specific and system-specific information. The MR system has a magnet 10 for generation of a polarization field $B_0$. An examination subject 11, who lies on a patient bed 12, can be transported into the inside of the magnet. The basic functionality of an MR system for detection of MR signals by irradiation of RF pulses and switching of magnetic field gradients is known to those skilled in the art and need not be further described in detail herein.

The MR system has a central control unit 100 that is used to generate the MR images and to generate the simulated MR images. The central control unit has an image generation unit 110 that is provided with an imaging sequence that establishes the sequence of the RF pulses and gradient switches. Via an input unit (not shown), imaging parameters can be set that are then supplied to the image generation unit. An operator can set imaging parameters such as echo time, repetition time, excitation angle etc. These imaging parameters are passed to a simulation unit 120 that conducts a simulation calculation in order to calculate a simulated MR image that can be presented to the operator on a display unit 130. The data necessary for the simulation calculation can be stored in a memory unit 140. The signal portions that can each contain a portion of the complete signal are stored in this data set for different anatomical regions. Signal portions in the sense of the present invention are, for example: the proton density (i.e. the influence of the proton density on the simulated MR image); the $T_1$ time or the effect of the $T_1$ time on the simulated image; the $T_2$ time; the diffusion; the perfusion; the flux in the MR image; the magnetization transfer; and the susceptibility. Furthermore, image planes that are typically used in order to create an image of the selected anatomical region can be stored in the memory unit for the different anatomical regions. For example, given the generation of an MR image of the head it is typical to establish a transversal slice plane above the level of the eyes in which the white brain matter, the grey brain matter and the liquor are contained. These predetermined slice planes can be stored in the memory unit 140 and can be suggested (in a prompt) as a slice plane for an MR image when the anatomical region that should be examined is known. The proposed slice image plane for the simulation corresponds with a greater probability to the plane that is to be measured later when current overview MR images acquired by the operator are used and are compared with the stored data set, wherein the typical image plans can then be adapted to the respective examination subject. Furthermore, a signal-to-noise information unit 150 is provided that extracts signal-to-noise information (such as the signal-to-noise ratio of the current MR system) and passes it to the simulation unit 120, which takes the signal-to-noise ratios into account in the calculation of the simulation image. For example, current signal-to-noise values can be extracted from the overview exposures and can be taken into account in the simulation calculation in that the signal-to-noise values of previous measurements of the examination subject that are to be expected are adopted. The signal-to-noise ratio can furthermore change across the image plane. This information can likewise be artificially superimposed on the image to be simulated, so a realistic impression of the contrast is achieved before the actual measurement. An anatomical information unit 160 determines the position of the image to be simulated and relays this information to the simulation unit 120. The image plane can either be manually selected by the user or the image plane can be automatically suggested with knowledge of the acquisition coil being used. Furthermore, this information can also be extracted from the name of the measurement program from which the imaging sequence that should be simulated was selected. The units 110-160 that are shown in FIG. 1 do not need to be fashioned as separate units; they can also be integrated into fewer units or into only one central control unit.

The steps for generation of the simulated MR image are shown in a flowchart in FIG. 2. After the start of the method in Step 20, the imaging parameters for the imaging sequence that should be used in the signal acquisition are established in Step 21. The number of the possible imaging parameters that must be established in order to be able to conduct a simulation of the signals of the imaging sequence results through the selection of an imaging sequence. These imaging parameters are typically selected by the operator who wants to test which contrast the expected MR image will have. In addition to the selection of the imaging parameters, the selection of the anatomy ensues in Step 22. The anatomical region can hereby be directly, manually selected by the user in that the user establishes precisely one image plane on overview images, for example. It is likewise possible that an image plane that corresponds to the image plane typically selected in this anatomical region is suggested automatically using the selected acquisition coil or using the selected measurement program.

Furthermore, the signal-to-noise ratio of the MR system is detected in Step 23, wherein signal-to-noise values from preceding overview measurements can hereby be taken into account as mentioned above. Furthermore, protocol-dependent parameters of the spatial resolution (for example measurement field size, matrix size, supersampling, partial Fourier spaces, averages, asymmetrical matrices or asymmetrical measurement fields, bandwidths used and/or image filters used) also enter into the determination of the signal-to-noise ratio. An MR image can now be simulated in Step 24 with the information extracted in Step 21 through Step 23. This optimally ensues promptly (i.e. in real time) so that an operator immediately has information about the result a short time later upon adjusting various imaging parameters if the simulated MR image was shown in Step 25. If it is recognizable in the shown, simulated MR image that the simulated contrast does not deliver the desired result, the implementation of the test measurement can be canceled, which leads to a savings of time and costs. The method ends in Step 26.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for simulating a diagnostic magnetic resonance image of an examination subject, said diagnostic image of the examination subject being obtained with a magnetic resonance data acquisition system, said method comprising the steps of:
   for a diagnostic magnetic resonance image that will be obtained from an examination subject using a magnetic resonance data acquisition system, determining imaging parameters for an imaging sequence that will be used to operate the magnetic resonance data acquisition system to obtain the diagnostic magnetic resonance image;
   determining at least one item of anatomical information of the examination subject;
   determining signal-to-noise information of said magnetic resonance data acquisition system;
   in a processor, automatically simulating a simulated magnetic resonance image in real time, dependent on the determined imaging parameters, the determined anatomical information and the determined signal-to-noise information by, dependent on the anatomical information, automatically determining signal portions comprising a portion of a complete signal for the simulated magnetic resonance image; and
   visually displaying the simulated magnetic resonance image.

2. A method as claimed in claim 1 comprising selecting said imaging parameters from the group consisting of repetition time $T_R$, echo time $T_E$, excitation angle, refocusing angle, existence of magnetization transfer pulses, fat saturation pulses, inversion times, use of contrast agent, slice thickness, slice interval, PAT factor, echo train length, variation of refocusing angle, and spatial resolution.

3. A method as claimed in claim 1 comprising additionally determining at least one of an excitation profile and a refocusing slice profile of an RF pulse used in said imaging sequence, and, in said processor, generating said simulated magnetic resonance image also dependent on the determined at least one of said excitation profile and said refocusing slice profile.

4. A method as claimed in claim 1 wherein a contrast agent will be administered to obtain said diagnostic magnetic resonance image, and determining a contrast response of said imaging sequence to the administration of said contrast agent, by using only central k-space rows, if said contrast response changes during said imaging sequence, to simulate said simulated magnetic resonance image in said processor.

5. A method as claimed in claim 1 comprising selecting a coil for use in detecting a magnetic resonance signal in said magnetic resonance data acquisition device to obtain said diagnostic magnetic resonance image, and automatically determining said item of anatomical information dependent on the selected coil.

6. A method as claimed in claim 1 comprising determining said anatomical information from a name of said imaging sequence.

7. A method as claimed in claim 1 comprising, from said anatomical information, automatically determining in said processor a position of an image plane for said simulated magnetic resonance image, the position of the image plane being a most probable image plane for the determined anatomical information.

8. A method as claimed in claim 1 comprising determining said signal-to-noise information from magnetic resonance images of the examination subject that were previously acquired.

9. A method as claimed in claim 8 comprising, in at least one of said magnetic resonance images of the examination subject that were previously acquired, comparing a predetermined data set that, dependent on the anatomical information, determines signal portions having a portion of a complete signal for the simulated magnetic resonance image, and selecting an image plane for a position of the simulated magnetic resonance image dependent on said comparison.

10. A method as claimed in claim 1 comprising determining said signal-to-noise information by extracting a local variation of signal-to-noise information from magnetic resonance images of the examination subject that were previously acquired.

11. A magnetic resonance system for simulating a diagnostic magnetic resonance image of an examination subject prior to obtaining said diagnostic image of the examination subject, comprising:
   a magnetic resonance data acquisition system configured to obtain magnetic resonance data representing a diagnostic image of an examination subject;
   a processor and an input unit configured to determine imaging parameters for an imaging sequence that will be used to operate the magnetic resonance data acquisition system to obtain the diagnostic magnetic resonance image;
   a unit in said processor configured to determine at least one item of anatomical information of the examination subject;
   a unit in said processor configured to determine signal-to-noise information of said magnetic resonance data acquisition system;
   said processor being configured to automatically simulate a simulated magnetic resonance image in real time, dependent on the determined imaging parameters, the determined anatomical information and the determined signal-to-noise information by, dependent on the anatomical information, automatically determining signal portions comprising a portion of a complete signal for the simulated magnetic resonance image; and
   a display unit at which said processor causes the simulated magnetic resonance image to be displayed.

* * * * *